(12) United States Patent
Chen et al.

(10) Patent No.: US 11,990,351 B2
(45) Date of Patent: May 21, 2024

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Jiun-Ting Chen, Hsinchu (TW); Chih-Wei Wu, Yilan County (TW); Szu-Wei Lu, Hsinchu (TW); Tsung-Fu Tsai, Changhua County (TW); Ying-Ching Shih, Hsinchu (TW); Ting-Yu Yeh, Hsinchu (TW); Chen-Hsuan Tsai, Taitung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 125 days.

(21) Appl. No.: 17/213,241

(22) Filed: Mar. 26, 2021

(65) Prior Publication Data

US 2022/0310411 A1   Sep. 29, 2022

(51) Int. Cl.
*H01L 23/13* (2006.01)
*H01L 21/304* (2006.01)
(Continued)

(52) U.S. Cl.
CPC ........ *H01L 21/561* (2013.01); *H01L 21/3043* (2013.01); *H01L 23/13* (2013.01);
(Continued)

(58) Field of Classification Search
None
See application file for complete search history.

(56) References Cited

U.S. PATENT DOCUMENTS

| 8,993,380 B2 | 3/2015 | Hou et al. |
| 9,281,254 B2 | 3/2016 | Yu et al. |

(Continued)

FOREIGN PATENT DOCUMENTS

| TW | 201539678 | 10/2015 |

OTHER PUBLICATIONS

"Office Action of Taiwan Counterpart Application", dated Jan. 13, 2021, p. 1-p. 6.

*Primary Examiner* — Telly D Green
(74) *Attorney, Agent, or Firm* — JCIPRNET

(57) ABSTRACT

A semiconductor package and a manufacturing method thereof are provided. The semiconductor package includes at least one semiconductor die, an interposer, an encapsulant, a protection layer and connectors. The interposer has a first surface, a second surface opposite to the first surface and sidewalls connecting the first and second surfaces. The semiconductor die is disposed on the first surface of interposer and electrically connected with the interposer. The encapsulant is disposed over the interposer and laterally encapsulating the at least one semiconductor die. The connectors are disposed on the second surface of the interposer and electrically connected with the at least one semiconductor die through the interposer. The protection layer is disposed on the second surface of the interposer and surrounding the connectors. The sidewalls of the interposer include slanted sidewalls connected to the second surface, and the protection layer is in contact with the slant sidewalls of the interposer.

20 Claims, 13 Drawing Sheets

(51) Int. Cl.
- *H01L 21/56* (2006.01)
- *H01L 23/00* (2006.01)
- *H01L 23/31* (2006.01)
- *H01L 25/065* (2023.01)
- *H01L 25/18* (2023.01)
- *H01L 23/14* (2006.01)
- *H01L 23/48* (2006.01)

(52) U.S. Cl.
CPC ...... *H01L 23/3135* (2013.01); *H01L 25/0655* (2013.01); *H01L 25/18* (2013.01); *H01L 21/563* (2013.01); *H01L 23/147* (2013.01); *H01L 23/3185* (2013.01); *H01L 23/3192* (2013.01); *H01L 23/481* (2013.01); *H01L 24/73* (2013.01); *H01L 24/97* (2013.01); *H01L 2224/73204* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 11,410,897 B2* | 8/2022 | Wu .................... H01L 25/0657 |
| 2014/0225273 A1* | 8/2014 | Thacker ............... H01L 23/481 257/774 |
| 2015/0303075 A1* | 10/2015 | Han ....................... H01L 24/97 438/113 |
| 2020/0006286 A1* | 1/2020 | Chen .................... H01L 21/486 |
| 2020/0411399 A1* | 12/2020 | Wu ...................... H01L 21/561 |

* cited by examiner

SEMICONDUCTOR PACKAGE AND MANUFACTURING METHOD THEREOF

BACKGROUND

For multi-die packages, the choices and the arrangement of the packaging materials relative to the packaged semiconductor dies have become an important issue for packaging technology and have impacts on reliability of the packaged products.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
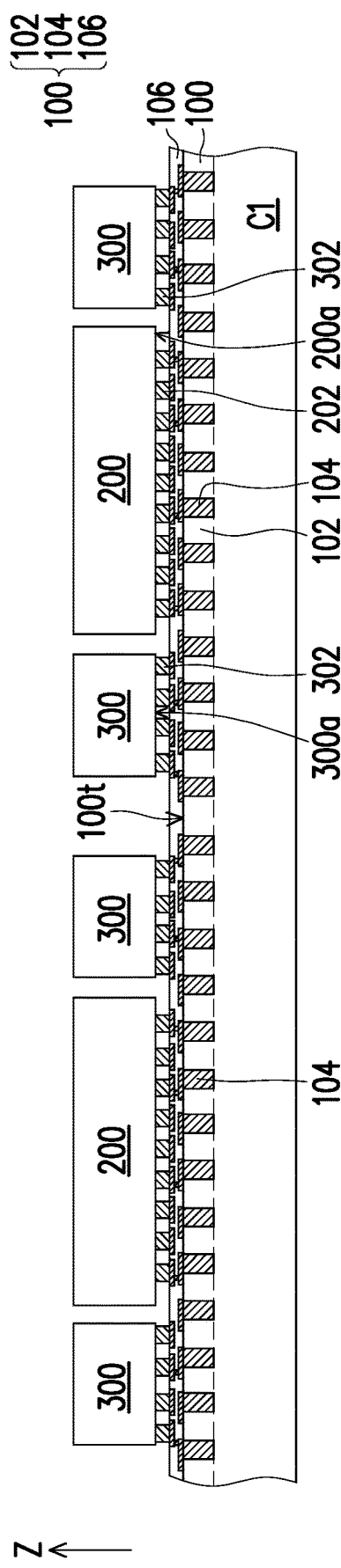
FIG. 1 to FIG. 10 are schematic cross-sectional views illustrating the structures formed at various stages of a manufacturing method of a semiconductor package connected to a circuit substrate according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 10 are schematic cross-sectional views illustrating the structures formed at various stages of a manufacturing method of a semiconductor package connected to a circuit substrate according to some embodiments of the present disclosure. FIG. 6A is a schematic top view of the structure shown in FIG. 6 according to one embodiment of the present disclosure. FIG. 8A is a schematic top view of the structure shown in FIG. 8 according to one embodiment of the present disclosure.

Referring to FIG. 1, in some embodiments, a carrier C1 is provided with an interposer 100 disposed thereon. In some embodiment, the carrier C1 may be a glass carrier, a semiconductor wafer or any suitable carrier for the manufacturing method of the packages. In some embodiments, referring to FIG. 1, the interposer 100 may be made of a semiconductor material (such as a bulk silicon wafer). In some embodiments, the interposer 100 includes conductive vias 104 formed within a semiconductor material bulk substrate 102 and a redistribution structure 106 formed on the bulk substrate 102. In FIG. 1, the conductive vias 104 are embedded within the bulk substrate 141 and penetrate through the bulk substrate 102 and top ends of the conductive vias 104 are connected with the redistribution structure 106. In some embodiments, the redistribution structure 106 is optionally formed and may be omitted and not considered as part of the interposer 100. In some embodiments, the interposer 100 and the carrier C1 are parts of a semiconductor wafer.

Referring to FIG. 1, in some embodiments, semiconductor dies 200, 300 are provided and mounted to the interposer 100. For example, the semiconductor dies 200, 300 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the semiconductor dies 200, 300 may independently be or include a memory die such as a high bandwidth memory (HBM) die. In some embodiments, the semiconductor dies 200, 300 may be the same type of dies or perform the same functions. In some embodiments, the semiconductor dies 200, 300 may be different types of dies or perform different functions. In certain embodiments, the semiconductor dies 200 may include logic dies, and the semiconductor dies 300 include memory dies.

In some embodiments, the semiconductor dies 200, 300 are fabricated from or include semiconductor substrate made of semiconductor materials, such as semiconductor materials of the groups III-V of the periodic table. In some embodiments, the semiconductor dies 200, 300 include elementary semiconductor materials such as silicon or germanium, compound semiconductor materials such as silicon carbide, gallium arsenide, indium arsenide, or indium phosphide or alloy semiconductor materials such as silicon germanium, silicon germanium carbide, gallium arsenide phosphide, or gallium indium phosphide. In some embodiments, the semiconductor dies 200, 300 include active components (e.g., transistors, diodes or the like) and optionally passive components (e.g., resistors, capacitors, inductors, or the like) formed therein. In some embodiments, the semiconductor dies 300 are memory dies including multiple memory chips stacked on top of a controller chip.

In some embodiments, as shown in FIG. 1, die connectors 202, 302 are located between the interposer 100 and active surfaces 200a, 300a of the semiconductor dies 200, 300 to electrically connect the semiconductor dies 200, 300 with other components or to the circuit substrate. In some embodiments, the semiconductor dies 200, 300 are bonded (facing down) to the metallic patterns of the redistribution structure 106 via the die connectors 202, 302 and are electrically connected with the conductive vias 104 formed within the bulk substrate 102 of the interposer 100. According to some embodiments, the semiconductor dies 200, 300 are disposed with their active surfaces 200a, 300a facing the mounting surface 100t of the interposer 100. In some embodiments, as illustrated in FIG. 1, the conductive vias 104 may extend between the top and bottom surfaces of the bulk substrate 102, and extend in a thickness direction Z of the interposer 100. In one embodiment, the conductive vias 104 extending through the bulk substrate 102 of the interposer 100 are through semiconductor vias (TSVs). In some embodiments, a material of the conductive vias 104 includes a metal material such as copper, titanium, tungsten, aluminum, combinations thereof, alloys thereof or the like. In some embodiments, the redistribution structure 106 may be optional. In some embodiments, the redistribution structure 106 is formed with conductive patterns or pads that are embedded in one or more passivation layers and are connected with the die connectors 202, 302 and the conductive vias 104.

In some embodiments, the semiconductor dies 200, 300 are bonded to the interposer 100 through a bonding process, and the conductive vias 104 and the redistribution structure 106 are electrically connected with the semiconductor dies 200, 300. In one embodiment, the bonding process includes performing a heating process or a reflow process.

Figure 2:
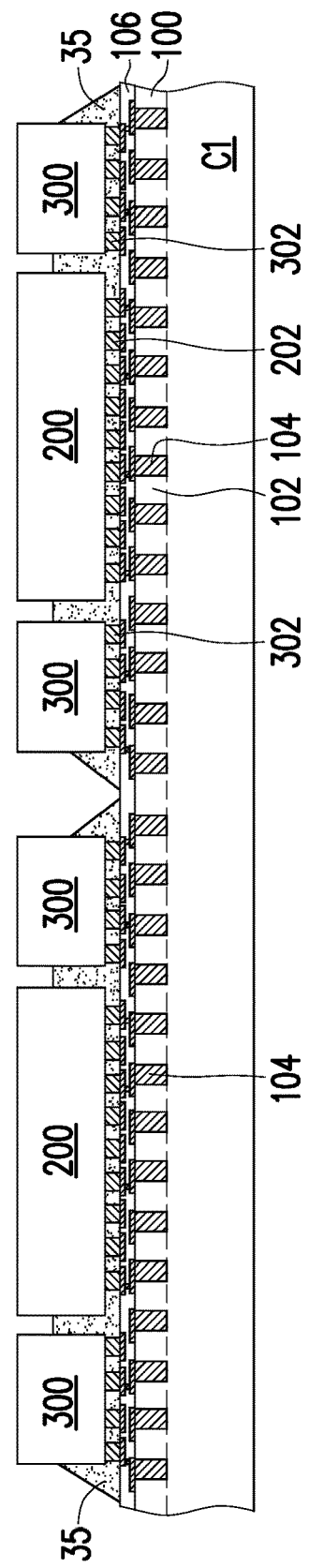

Referring to FIG. 2, in some embodiments, after bonding the semiconductor dies 200, 300 to the interposer 100, an underfill 35 may be provided and filled between the semiconductor dies 200, 300 and the interposer 100 to protect the die connectors 202, 302 against thermal or physical stresses and secure the electrical connection of the semiconductor dies 200, 300 with the interposer 100. In some embodiments, the underfill 35 is formed by capillary underfill filling (CUF). In some embodiments, a curing process may be performed to consolidate the underfill 35. In some embodiments, as shown in FIG. 1, the underfill 35 not only fills up the interstices between the die connectors 202, 302 for securing the connectors, but also fills into the gaps between the semiconductor dies 200, 300. In some alternative embodiments, the underfill 35 may overflow and extend beyond the semiconductor dies 200, 300, depending on the spacing and relative positions of the semiconductor dies 200, 300 over the interposer 100.

It is understood that the semiconductor package may include more or fewer semiconductor dies on the interposer 100 as well as other components (e.g., passive components, interconnect structures, support structures, etc.) thereon, but the disclosure is not limited thereto. Furthermore, whilst the process is currently being illustrated for a Chip-on-Wafer-on-Substrate (CoWoS) package, the disclosure is not limited to the package structure shown in the drawings, and other types of wafer level packages are also meant to be covered by the present disclosure and to fall within the scope of the appended claims.

Figure 3:
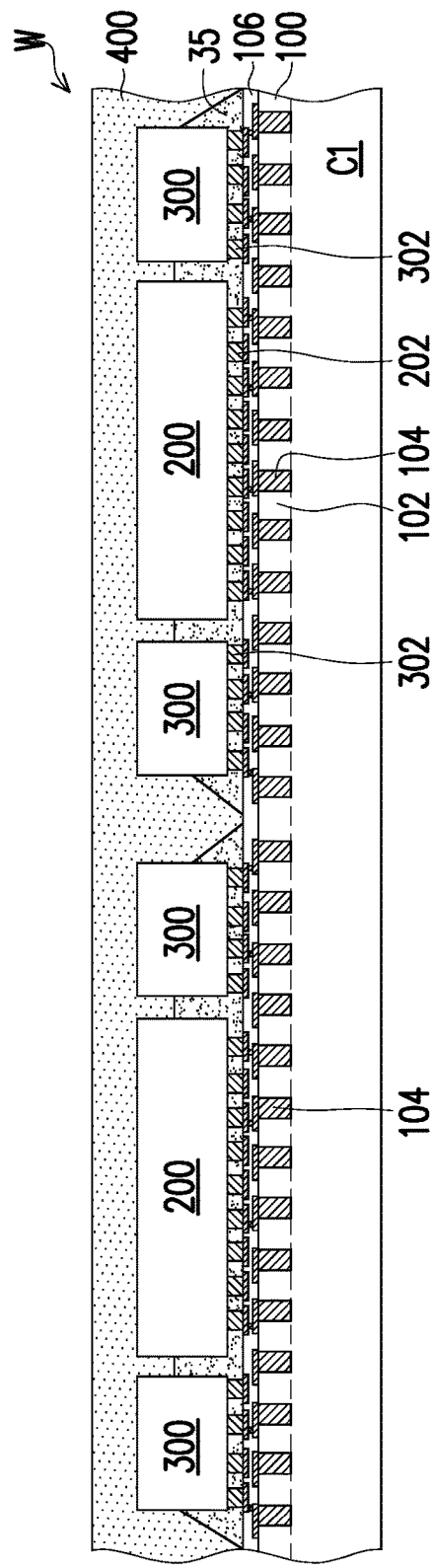

In FIG. 3, in some embodiments, a molding compound 400 is formed over the interposer 100 placed on the carrier C1, wrapping around and encapsulating the semiconductor dies 200, 300 and the underfill 35. As shown in FIG. 3, a molded structure W is formed on the carrier C1. In some embodiments, the molding compound 400 is formed by supplying an encapsulation material (not shown) into a mold and the molding compound 400 completely covering the semiconductor dies 200, 300, the underfill 35 and the interposer 100, and filling up the gaps between the semiconductor dies 200 and 300. Optionally, a curing process may be performed to cure the encapsulation material to form the molding compound 400. In some embodiments, the molding compound 400 is formed through over-molding. In some embodiments, the encapsulation material of the molding compound 400 includes a resin such as an epoxy resin, a phenolic resin or a thermosetting resin material.

Figure 4:
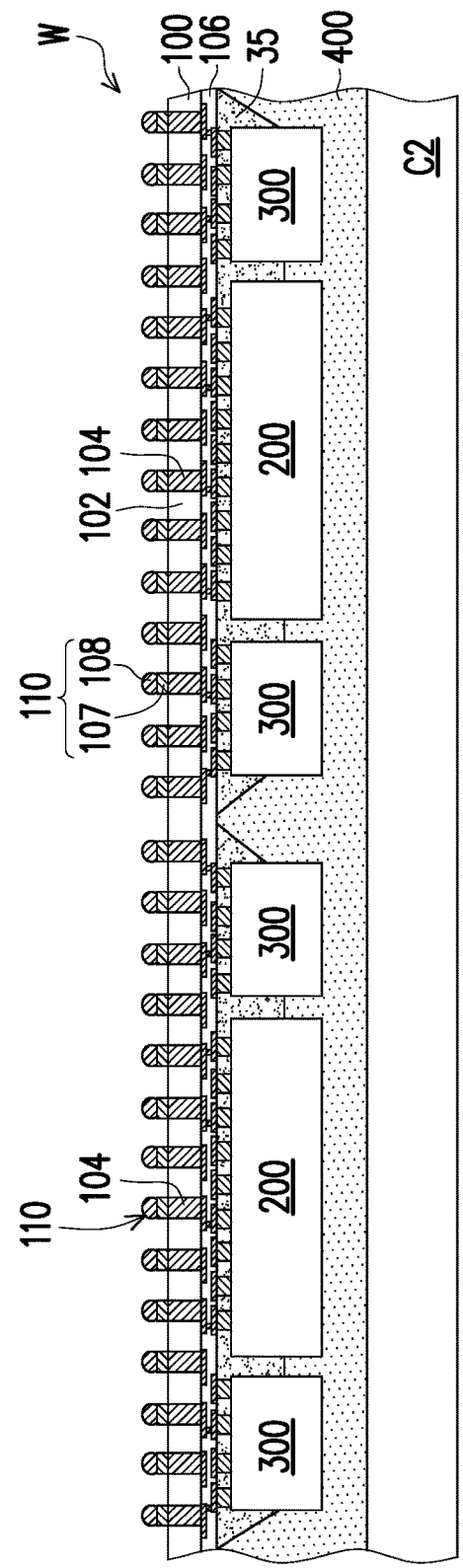

Referring to FIG. 4, in some embodiments, after forming the molding compound 400, a carrier C2 is provided and adhered to the molding compound 400. In some embodiments, a debond layer (not shown) may be provided on the carrier C2, and the material of the debond layer may be any material suitable for bonding and debonding the carrier C2 from the above layer(s) or any structure thereon. In some embodiments, the debond layer may include a release layer (such as a light-to-heat conversion ("LTHC") layer). The carrier C1 is removed to expose the conductive vias 104 and the molded structure W is remained on the carrier C2. In some embodiments, the carrier C1 is removed through a grinding process or a wafer thinning process. Then the molded structure W is flipped (turned upside down). As shown in FIG. 4, in some embodiments, connectors 110 are formed on the exposed conductive vias 104 to provide electrical connection with other components. For example, the connectors 110 may include controlled collapse chip connection (C4) bumps, micro bumps, metal pillars with solder materials, combination thereof, or the like. In some embodiments, the connector 110 includes a metal post 107 and a solder material 108 formed thereon. In one embodiment, the connector 110 includes a copper post with a thickness ranging from about 10 microns to about 50 microns and a solder paste formed thereon. In some embodiments, the connector 110 includes C4 bumps. Also, the connectors 110 may further include under-bump metallurgies formed on the exposed ends of the conductive vias 104. In some embodiments, some connectors 110 are electrically connected with the semiconductor dies 200, 300 through the conductive vias 104 and the redistribution structure 106 of the interposer 100.

Figure 5:
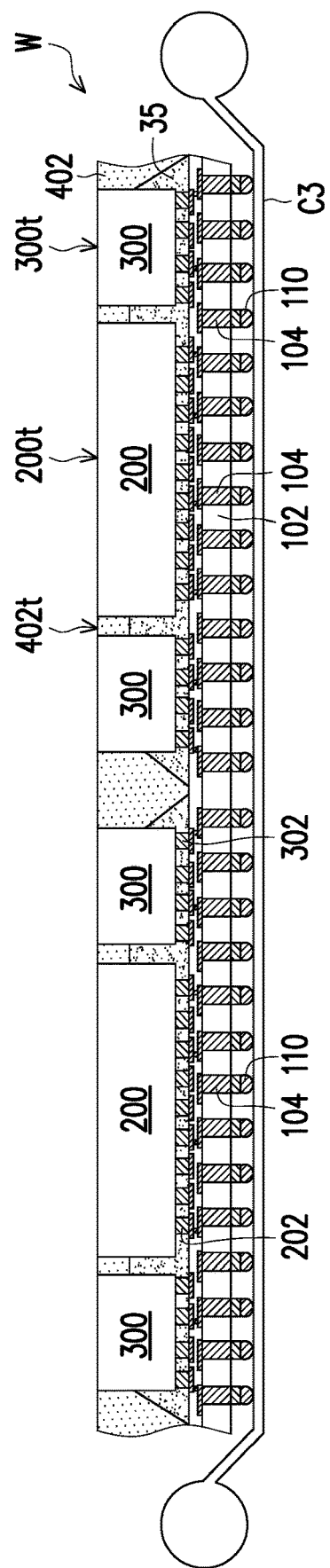

Referring to FIG. 5, the molded structure W is separate from the temporary carrier C2, flipped again and then transferred to another carrier C3. In one embodiment, the carrier C3 is a tape film carrier suitable for bonding and debonding the molded structure W. In some embodiments, a planarization process is performed to the molding compound 400 of the molded structure W thinning the molding compound 400 to form an encapsulant 402 encapsulating the underfill 35 and laterally wrapping the semiconductor dies 200, 300. In some embodiments, the planarization process includes a chemical mechanical polishing (CMP) process. In certain embodiments, the planarization process includes a mechanical grinding process. For example, the extra molding compound 400 above the top surfaces 200t, 300t of the semiconductor dies 200, 300 is removed during the planarization process, so that the top surface 402t of the encapsulant 402 is levelled and coplanar with the top surfaces 200t, 300t of the semiconductor dies 200, 300 after the planarization process.

Figure 6:
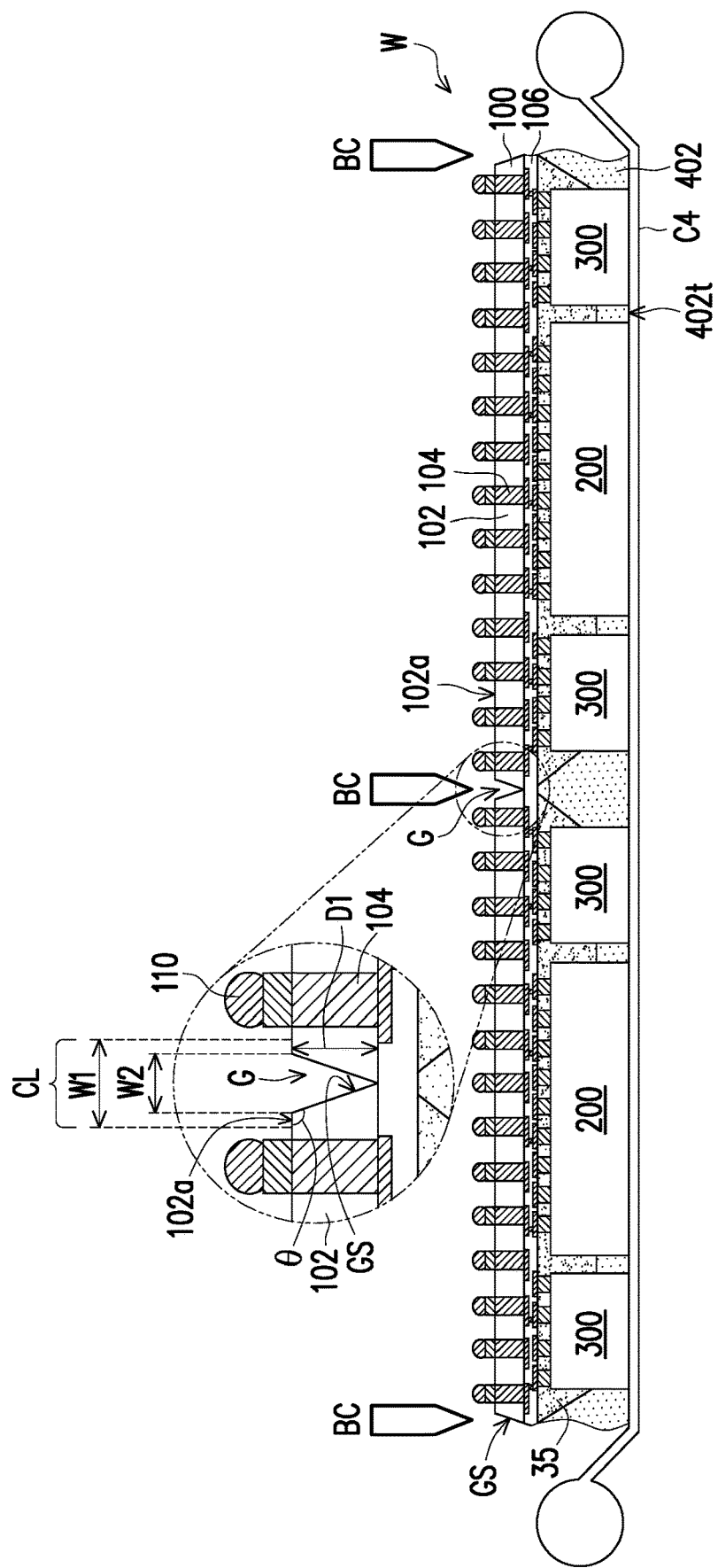
Figure 6A:
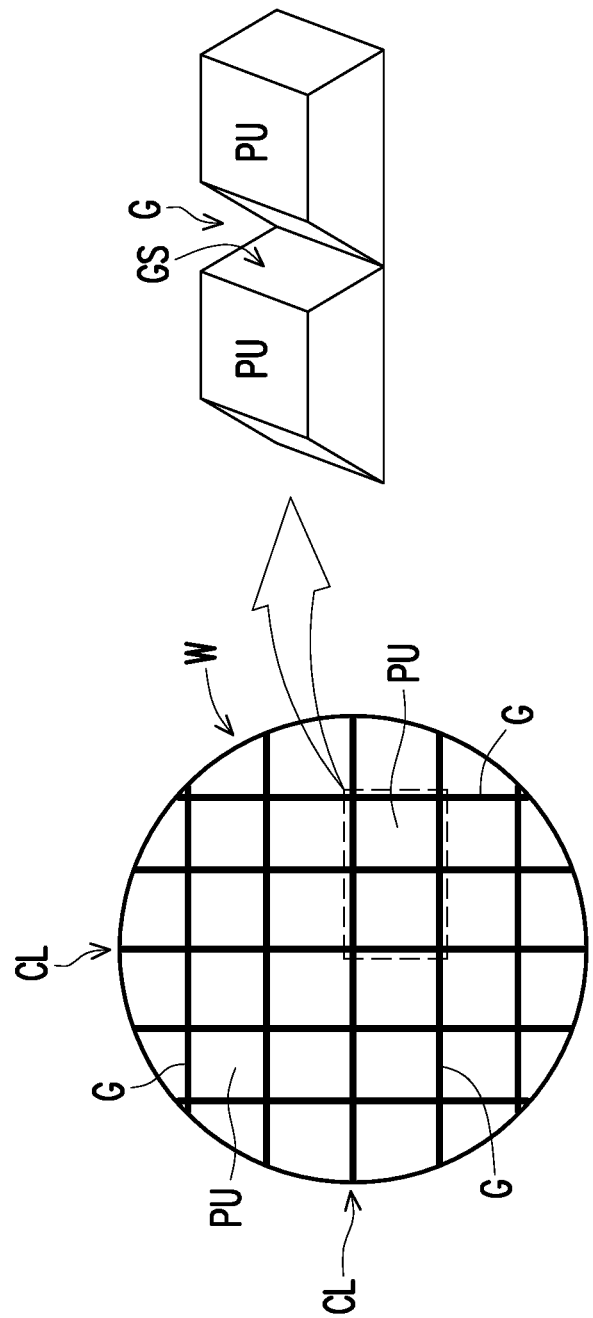
FIG. 6A is a schematic top view of a molded structure according to some embodiments of the present disclosure.

Referring to FIG. 6, the molded structure W is again separate from the carrier C3, flipped and then transferred to another carrier C4. In one embodiment, the carrier C4 is a tape film carrier suitable for bonding and debonding the molded structure W. As shown in FIG. 6, the surface 402t of the encapsulant 402 faces the carrier C4 and the connectors 110 located on the interposer 100 facing upward are exposed.

Referring to FIG. 6, a bevel-cutting process BC is performed to the interposer 100 to remove portions of the bulk substrate 102 of the interposer 100 along the cutting paths CL (i.e. predetermined virtual streets reserved for cutting or singulation) of the molded structure W, and cut lanes G are formed recessed into the bulk substrate 102 of the interposer 100 after the bevel-cutting process BC. In certain embodiments, as shown in the schematic enlarged view of a portion of the structure in the upper part of FIG. 6, the cutting path CL has a width W1 slightly larger than or substantially equivalent to a width W2 of the cut lane G. In general, the cut lane(s) G is overlapped with and located within the span(s) of the cutting path(s) CL. Through bevel cutting, the cutting edge(s) or cutting sidewall(s) GS of the bevel-cut cut lane(s) G does not form a right angle with the surface 102a of the bulk substrate 102. That is, the angle θ between the cutting sidewall GS and the surface 102a of the bulk substrate 102 is larger than 90 degrees and smaller than 180 degrees. In some embodiments, the angle θ between the cutting sidewall GS and the surface 102a of the bulk substrate 102 ranges from 120 degrees to 150 degrees. In one embodiment, as seen in the schematic enlarged view of a portion of the structure in the upper part of FIG. 6, the cut lane G has a V-shaped cross-section. It is understood that the cut lane G may be described as a groove with a V-shaped cross-section, but the bottom of the groove may be slightly rounded or flat and the cross-section is not a perfect V-shaped but a bucket shape. In one embodiment, from the top view of FIG. 6A, the molded structure W may be considered as a joined assembly of multiple package units PU (one block defined by the cutting paths CL) before the singulation process. In one embodiment, as shown in FIG. 6A, after the bevel-cutting process BC, the cut lanes G are formed in the molded structure W. Through bevel cutting, the cutting edge(s) or cutting sidewall(s) GS of the bevel-cut cut lane(s) G does not form a right angle with the surface 102a of the bulk substrate 102. In FIG. 6A, the cut lane G may be shaped as a square or rectangular ring along each to-be-formed package unit PU surrounding the dies and along the peripheral region(s) of the to-be-formed package unit PU. As shown in the partially enlarged view illustrating the bevel-cut cut lane G located between the package units PU, each cutting sidewall GS is a sloped sidewall, and the two facing cutting sidewalls GS between the adjacent package units PU form a V-shaped groove. In some embodiments, the bevel-cutting process BC includes performing a bevel cutting process with a bevel blade. In some embodiments, the bevel-cut lanes G are cut into the bulk substrate 102 of the interposer 100 with a depth D1. In some embodiments, the depth D1 is measuring from the top surface 102a of the bulk substrate 102 to the bottom of cut lane G. In some embodiments, in FIG. 6, the cut lane G penetrates through the whole thickness of the bulk substrate 102 of the interposer 100 (i.e. the depth D1 is substantially equivalent to the thickness of the bulk substrate 102). In some embodiments, the depth D1 of the cut lane G is smaller than the thickness of the bulk substrate 102. In some embodiments, the depth D1 of the cut lane G is larger than the thickness of the bulk substrate 102. In some embodiments, the depth D1 of the cut lane G is substantially the same as the whole thickness of the interposer 100. In some embodiments, the depth D1 of the cut lane G is larger than the whole thickness of the interposer 100, and the bottoms of the cut lanes G are recessed into the encapsulant 402. In one embodiment, the depth D1 ranges from about 50 microns to about 100 microns.

Figure 7:
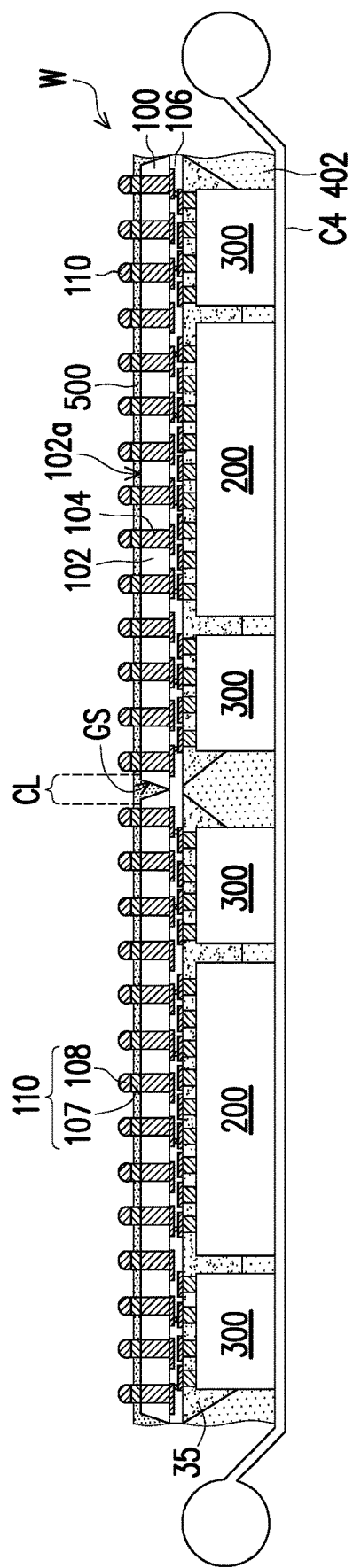

In FIG. 7, a protection layer 500 is formed over the interposer 100. In some embodiments, the protection layer 500 is formed to cover the top surface 102a of the bulk substrate 102 with the connectors 110 exposing from the protection layer 500. That is, the thickness of the protection layer 500 is not thick enough to fully cover the connectors 110, so that top portions of the connectors 110 are exposed or protruded from the protection layer 500. In one embodiment, the protection layer 500 covers the metal posts 107 but exposes the solder material 108. For example, the thickness of the protection layer 500 is about 5 microns to about 50 microns, less than or comparable to and the thickness of the metal posts 107 of the connectors 110. In some embodiments, the protection layer 500 has a thickness of about 30-40 microns. In some embodiments, the protection layer 500 is thick enough to fill up the cut lanes (the grooves) G. In some embodiments, the protection layer 500 at least covers the bottoms of the cut lanes G and portions of the cutting sidewalls GS. In one embodiment, the material of the protection layer 500 includes a resin material such as epoxy resin, phenolic resin or a thermosetting resin. In some embodiments, the material of the protection layer 500 is different from the material of the underfill 35. In some embodiments, the material of the protection layer 500 is different from the material of the underfill 35 and different from the material of the encapsulant 402. In some embodiments, the protection layer 500 is formed of an epoxy resin material using the mold underfill (MUF) process. In some embodiments, the protection layer 500 includes a material substantially the same as the material of the encapsulant 402. In some embodiments, the protection layer 500 is formed by performing a wafer-level molding process. Optionally, a baking process may be performed to further cure the protection layer 500. In embodiments, the protection layer 500 is formed through lamination, but the connectors 110 are partially exposed or protruded out of the protection layer 500 after the protection layer 500 is laminated onto the interposer 100. Later, after the formation of the protection layer 500, a plasma cleaning process may be performed to remove extra protection layer or residues to ensure the connectors 110 (i.e. at least the solder material 108) exposed from the protection layer 500. The formation of the protection layer 500 surrounding the connectors 110 can limit the flowing of the solder material and effectively prevent the wetting of the solder material 108 between the adjacent connectors 110, which results in good bonding joints with less or minimal reliability issues.

Figure 8:
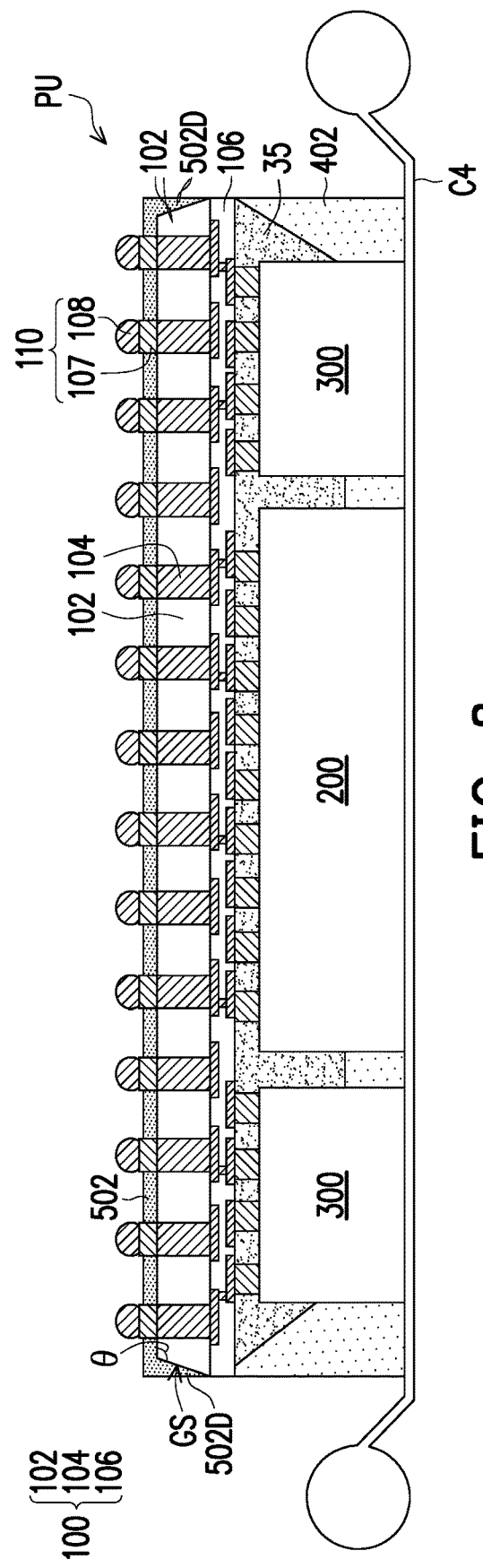
Figure 8A:
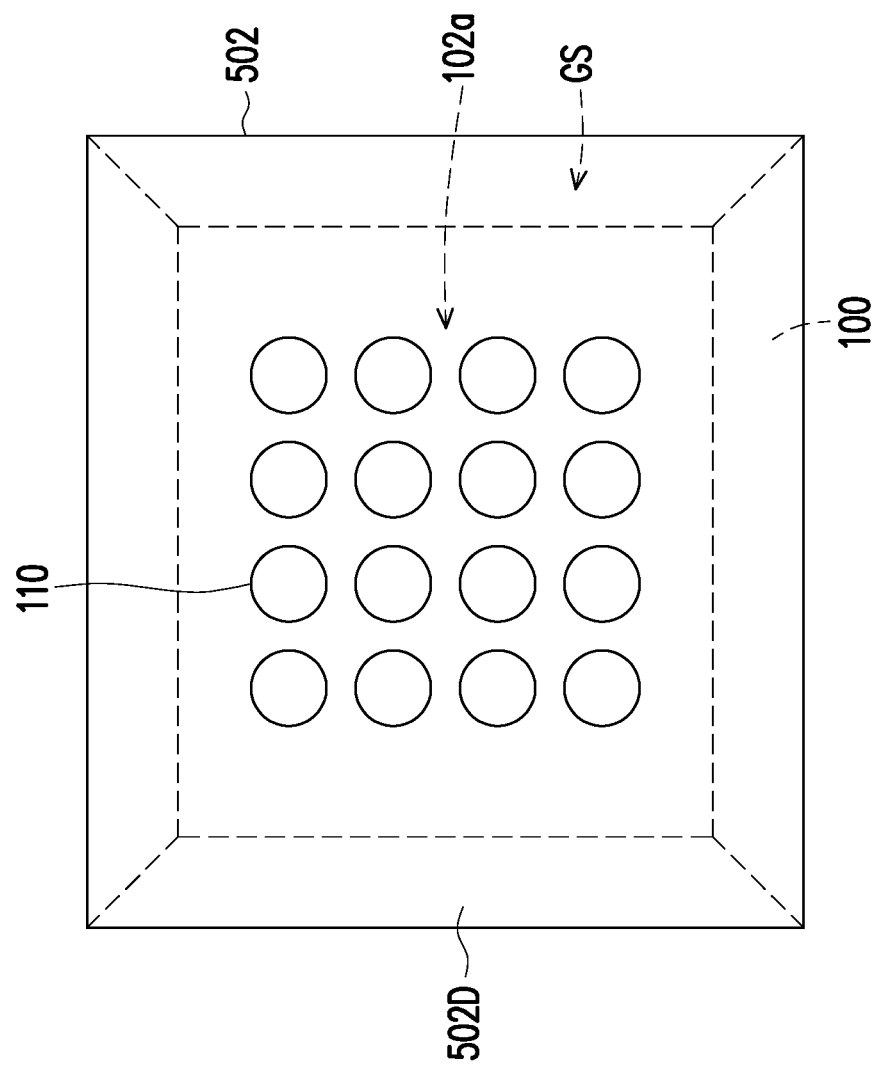
FIG. 8A is a schematic top view of a semiconductor package according to some embodiments of the present disclosure.

In some embodiments, as shown in FIG. 8, individual package units PU (only one is shown) are obtained by performing a singulation process. In some embodiments, the singulation process is performed to the molded structure W to separate the individual package units PU, for example, by cutting through the molded structure W along the cutting paths CL. In some embodiments, the singulation process includes performing a cutting process such as a wafer dicing process with a rotating blade. In some embodiments, the singulation process includes performing a laser cutting process. In some embodiments, the dicing or cutting process is performed by aiming at the cut lanes G. For example, the cutting aims at the cut lanes G, especially at the middle of the cut lanes G, so that the laser or blade cuts into the cut lanes G, cutting through the protection layer 500 filled in the cut lanes G, through the bottoms of the cut lanes G and cutting through the encapsulant 402 below the cut lanes G until reaching the carrier C4 to separate the package unit(s) PU.

Referring to FIG. 7 and FIG. 8, in some embodiments, the individual package unit PU is obtained by cutting through the cut lanes G and cutting the protection layer 500 filled in the grooves of the cut lanes G into halves. It is understood that small portions of the molded structure W may be sacrificed or lost during the singulation process, but it will not be described in details for the simplicity of illustration. In FIG. 8 and FIG. 8A, the singulated protection layer 502 covers the slant cutting edges or cutting sidewalls GS as well as the top surface 102a of the bulk substrate 102 of the interposer 100. After cutting, the protection layer 502 has a peripheral drape portion 502D that is in contact with and covers all of the slant side surfaces GS of the interposer 100, and the sidewalls 502DS of the peripheral drape portion 502D are aligned with and coplanar with the sidewalls 402S of the cut-through encapsulant 402. In certain embodiments, the remaining peripheral drape portion 502D has a thickness of about 20 microns or more to well protect the side surfaces GS of the interposer 100, so as to relieve the corner stress and prevent delamination and cracking at the corner(s) of the interposer 100. From the top view of FIG. 8A, it is clear that the protection layer 502 covers the four slant sidewalls GS. In FIG. 8A, the layer 502 is depicted as a transparent layer to show the underlying bulk structure 102, the number and the arrangement of the connectors 110 are exemplary and simplified for illustration purposes, and the package unit PU is seen as a rectangular block with four slant sidewalls GS and the peripheral drape portion 502D of the protection layer 502 is in a ring shape surrounding four sides of the interposer 100 and covering the four slant sidewalls GS.

In the above embodiments, through the bevel-cutting process, beveled edges or slant sidewalls GS are formed in the interposer, thus preventing corner cracking occurring in the redistribution structure 106 of the interposer 100 or delamination at the interfaces between the interposer 100 and the underfill 35. Furthermore, the formation of the protection layer 500/502 also reinforces the structures of the connectors 110 and avoids bump creeping failure after the thermal process(es). For example, with the existence of the protection layer 500/502 surrounding the metal posts 107 of the connectors 110, the wetting of the solder material between adjacent connectors 110 may be precluded. Further, the protection layer 500/502 covering the beveled edges or slant sidewalls GS (i.e. the peripheral drape portion 502D) may further reinforce the structure of the package from the thermal stress generated during the thermal process(es) due to the CTE mismatch of the packaging materials. Hence, the reliability of the package structure is significantly improved and the cracking risk is lowered by about 90%. That is, the cracking fail rate is approaching 0%.

In the previous embodiments, only two package units are shown for simplicity, however, the disclosure is not limited thereto. In some embodiments, the exemplary processes may be performed at a reconstructed wafer level, so that multiple package units are processed in the form of a molded structure or reconstructed wafer and multiple package units PU are obtained simultaneously. According to some embodiments, the package units PU may be further processed or assembled with other devices, sub-package units, circuit substrate or laminated circuit board.

Figure 9:
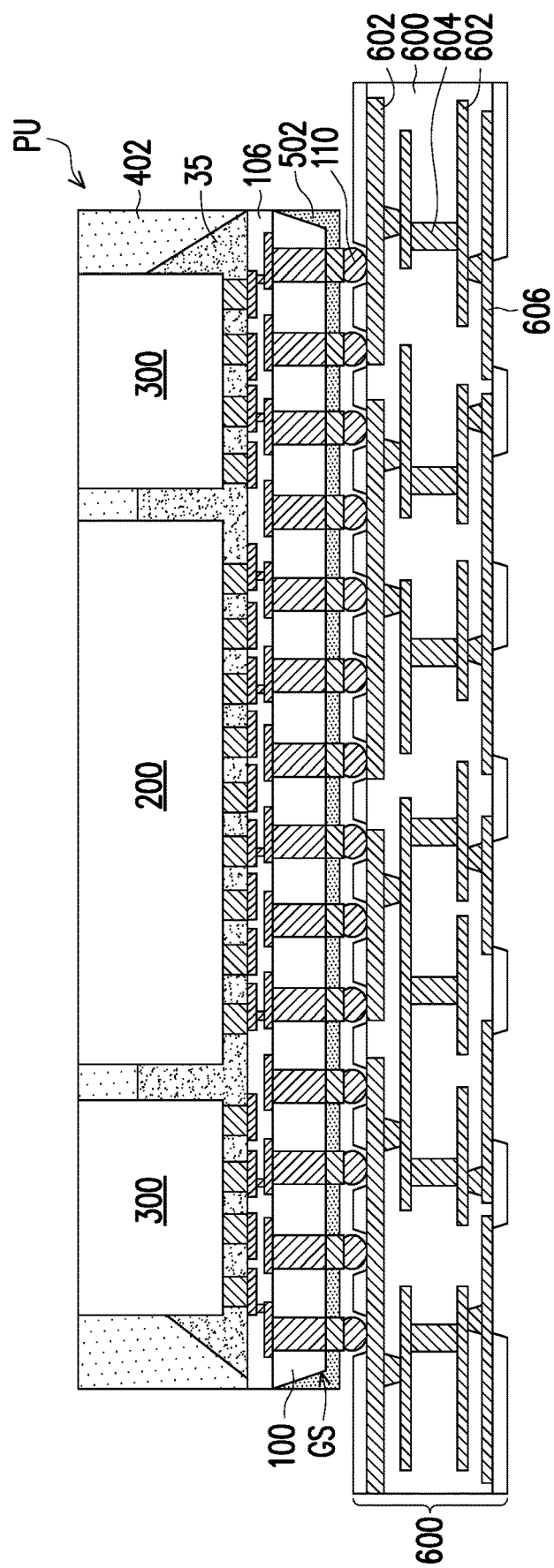
Figure 10:
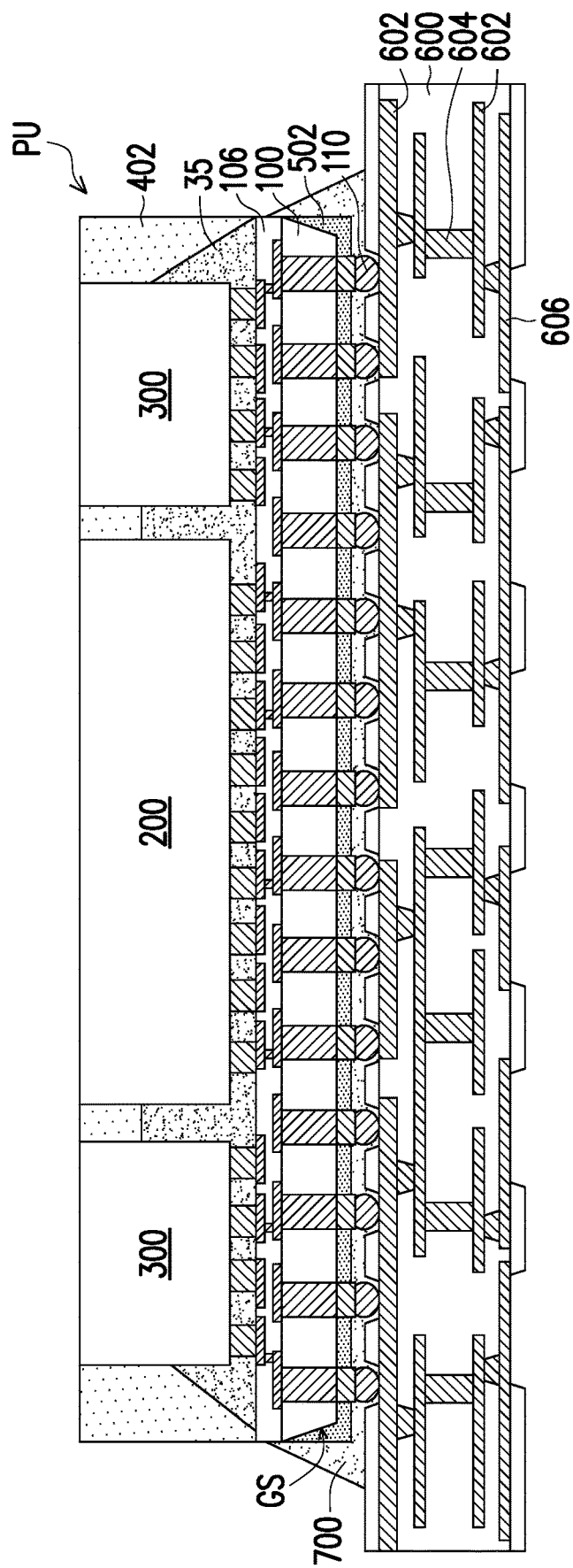

FIG. 9 and FIG. 10 are schematic cross-sectional view illustrating the semiconductor package connected to a circuit substrate according to some embodiments of the present disclosure. According to some embodiments of the present disclosure, the package unit PU is a semiconductor package provided via the processes illustrated in FIG. 1 through FIG. 8.

In some embodiments, as illustrated in FIG. 9, the package unit PU is bonded to a top metallization layer 602 of a circuit substrate 600 via the connectors 110. In some embodiments, the circuit substrate 600 includes a printed circuit board, a laminated board or a flexible laminate board. In some embodiments, the circuit substrate 600 may include one or more active components, passive components, or a combination thereof. In some embodiments, the circuit substrate 600 further includes metallization layers 602 and though vias 604 and bond pads 606 connected to the metallization layers 602 and the vias 604 to provide, for example, dual-side electrical connection. The metallization layers may be designed to connect the various components to form functional circuitry. In certain embodiments, conductive balls (not shown) may be formed on the bond pads 606 of the circuit substrate 600 for further electrical connection.

In some embodiments, in FIG. 10, another underfill 700 is provided and filled into the gaps between the connectors 110 and between the semiconductor package PU and the circuit substrate 600. In some embodiments, the material and the manufacturing method of the underfill 700 may be similar to the materials and manufacturing methods described for the underfill 35, and a detailed description thereof is omitted herein. In some embodiments, optional structures (not shown) such as a support structure, a heat sink, or a partition member may be optionally provided on the circuit substrate 600.

Figure 11:
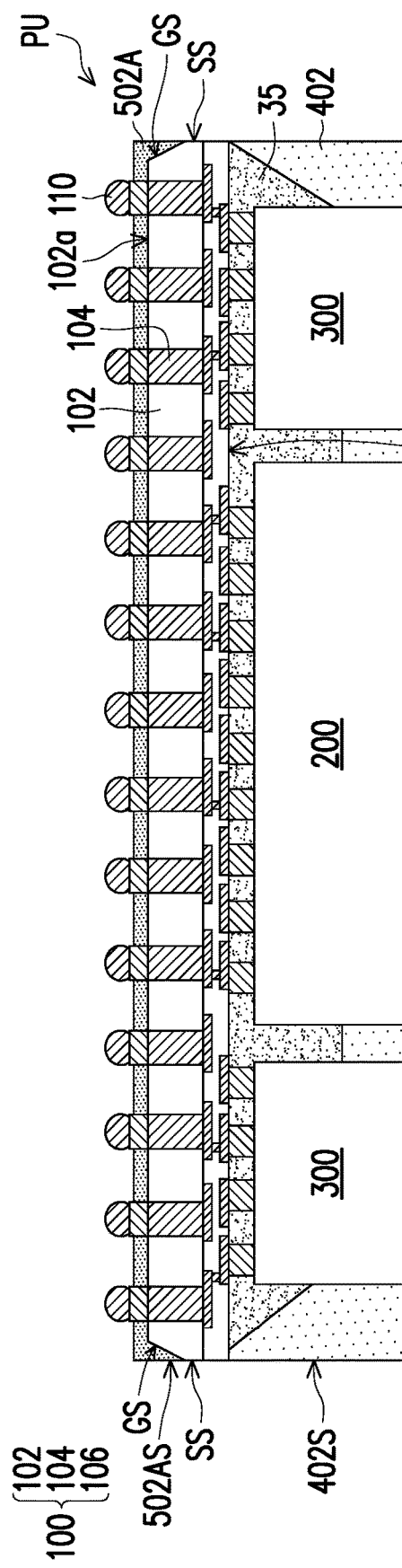
FIG. 11 and FIG. 12 are schematic cross-sectional views illustrating semiconductor packages according to some embodiments of the present disclosure.
Figure 12:
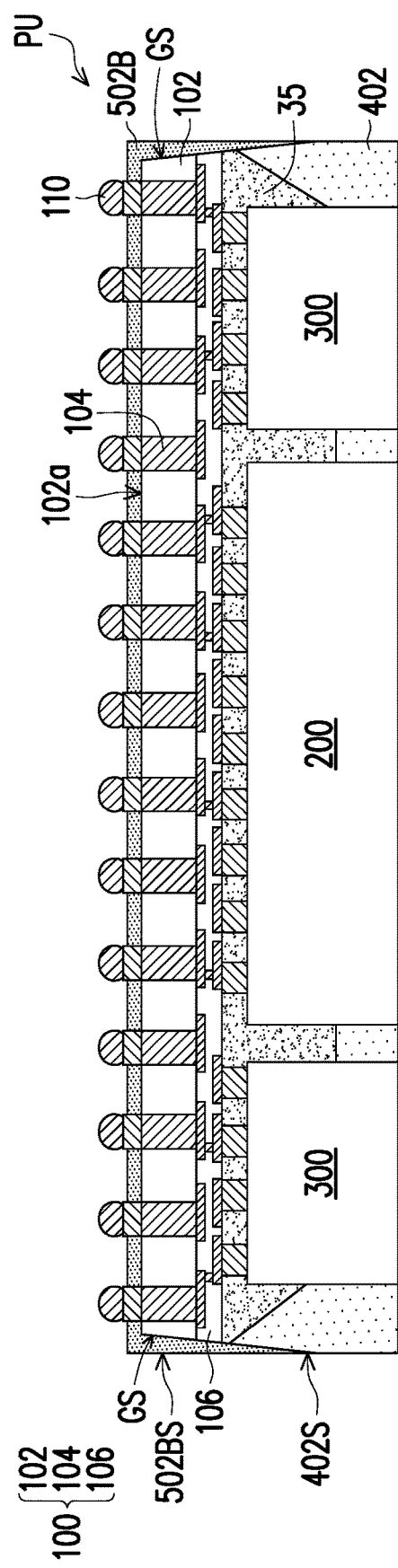

FIG. 11 and FIG. 12 are schematic cross-sectional views illustrating semiconductor packages according to some embodiments of the present disclosure. Depending on the depth of the cut lanes formed following the bevel-cutting process and the cutting location(s) during the singulation process, the resultant structures may be different.

In some embodiments, shallower grooves or cut lanes G are formed following the bevel cutting process, and the resultant cut lanes G do not penetrate through the bulk substrate 102 or the interposer 100. In FIG. 11, the beveled edge or slant sidewall GS of the interposer 100 extends from the top surface 102a to the middle part of the bulk substrate 102. In some embodiments, the interposer 100 has beveled edges GS and vertical sidewalls SS and the top surface 102a and the bottom surface 100b of the interposer 100 are connected by the beveled edges GS and vertical sidewalls SS. For example, the peripheral drape portion 502A of the protection layer 502 covers the whole slant sidewalls GS but does not extend to cover the vertical sidewalls SS. In one embodiment, through the same cutting process, the sidewalls 502AS of the peripheral drape portion 502A are aligned with and coplanar with the vertical sidewalls SS, and the vertical sidewalls SS are aligned with and coplanar with the sidewalls 402S of the encapsulant 402. Herein the vertical sidewall refers to a substantially straight and vertical sidewall about perpendicular to (e.g., 90±5 degrees) the horizontal plane (i.e. the plane of the mounting surface) of the interposer 100.

In some embodiments, deeper grooves or cut lanes G are formed following the bevel cutting process, and the resultant cut lanes G penetrate through the whole interposer 100 and into the encapsulant 402. In FIG. 12, the beveled edge or slant sidewall GS extends from the top surface 102a of the interposer 100 to the middle part of the encapsulant 402. In some embodiments, the peripheral drape portion 502B of the protection layer 502 covers the whole slant sidewalls GS and is in contact with sidewalls of the interposer 100, the underfill 35 and the encapsulant 402. In FIG. 12, the protection layer 502 covers the top surface 102a and all the side surfaces of the interposer 100. In other words, the whole side surfaces of the interposer 100 are protected by the peripheral drape portion 502B of the protection layer 502. In one embodiment, through the same cutting process, the sidewalls 502BS of the peripheral drape portion 502B are aligned with and coplanar with the sidewalls 402S (the exposed sidewall) of the encapsulant 402.

Figure 13:
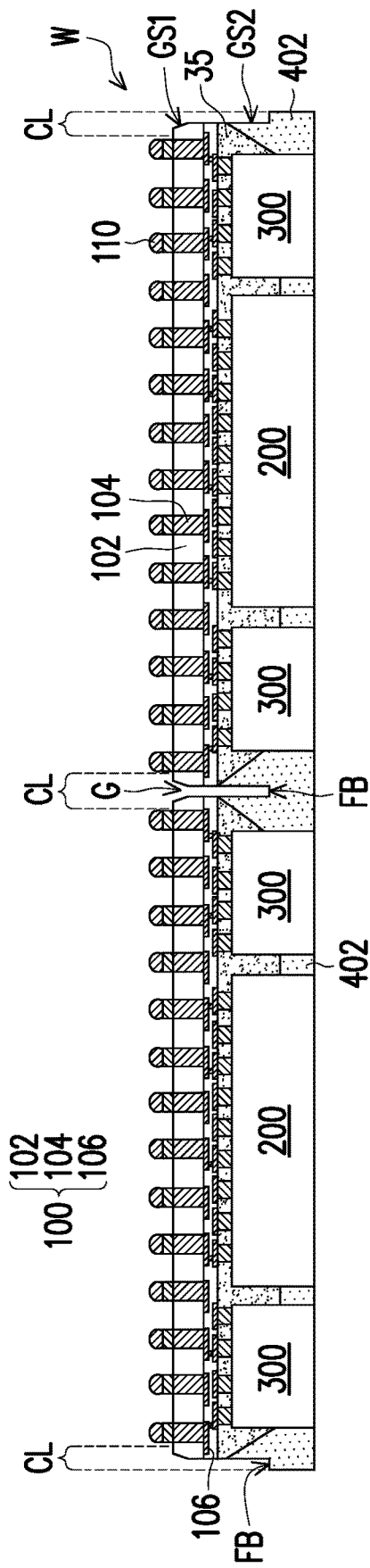
FIG. 13 to FIG. 15 are schematic cross-sectional views illustrating the structures formed at various stages of a manufacturing method of a semiconductor package according to some embodiments of the present disclosure.
Figure 14:
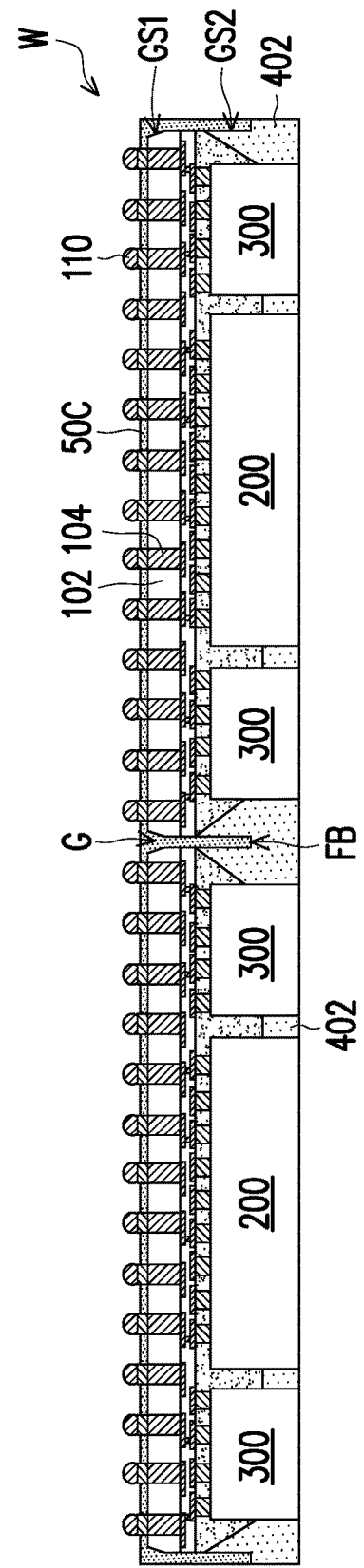
Figure 15:
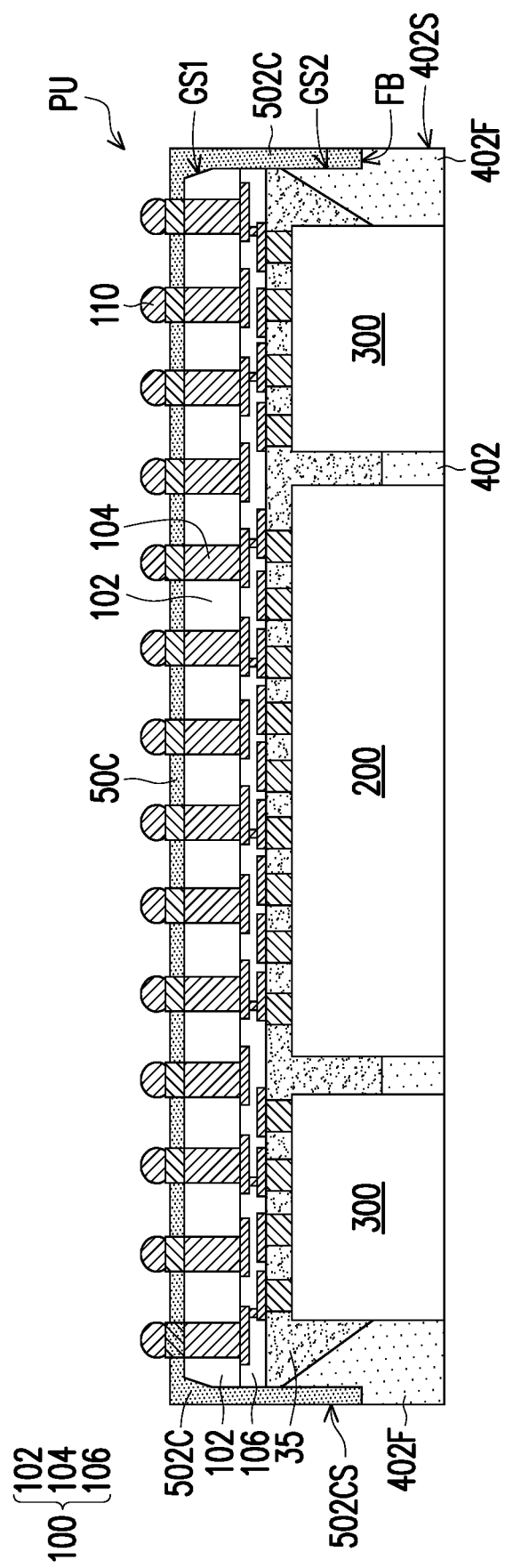

FIG. 13 to FIG. 15 are schematic cross-sectional views illustrating the structures formed at various stages of another manufacturing method of a semiconductor package according to some embodiments of the present disclosure.

Referring to FIG. 13, in some embodiments, following the bevel-cutting process performed to the interposer 100 of the molded structure W, portions of the bulk substrate 102 of the interposer 100 are removed to form beveled edges or slant sidewalls GS1 along the cutting paths CL. In some embodiments, after the bevel cutting process, a step cutting process is performed along the cutting paths CL to form cut lanes G with slant sidewalls GS1 and vertical sidewalls GS2. In some embodiments, the cut lanes G penetrate through the interposer 100 and are recessed into the encapsulant 402. In some embodiments, the cut lanes G also penetrate through the underfill 35. In some embodiments, the cutting width of the step cutting process is smaller than the cutting with of the bevel cutting process. In some embodiments, the cutting depth of the step cutting process is larger than the cutting depth of the bevel cutting process, however, neither is larger than the cutting depth of the singulation process. In one embodiment, the cutting depth ratio of the bevel cutting process to the step cutting process may be about 1:5.

In some embodiments, in FIG. 13, the cut lanes G are formed with upper slant sidewalls GS1, vertical sidewalls GS2 connected with the slant sidewalls GS1 and the flat bottoms FB. In FIG. 13, the beveled edge or slant sidewall GS1 extend from the top surface 102a to the middle part of the bulk substrate 102, and the vertical sidewall GS2 extends from the middle portion of the bulk substrate 102, over the sidewall of the underfill 35 and over the encapsulant 402 to the flat bottom FB. From the schematic cross section view of FIG. 13, the cut lane(s) G has an upper wider opening (shaped as a truncated cone) and a lower opening with upright sidewalls and a flat bottom FB.

Referring to FIG. 14, in some embodiments, the protection layer 50C is formed over the top surface 102a of the interposer 100 and fills up the cut lanes G. In some embodiments, the protection layer 50C covers the sidewalls GS1, GS2 and the flat bottoms FB.

Referring to FIG. 15, a singulation process is performed to the molded structure W along the cutting paths L to separate the package units PU. In some embodiments, the cutting process of the singulation process cuts into the cut lanes G, cutting through the protection layer 50C filled in the cut lanes G and through the encapsulant 402. In the obtained package unit PU, the peripheral drape portion 502C of the protection layer 50C covers the sidewalls GS1, GS2 and the flat bottoms FB. As seen in FIG. 15, through the two-stage cutting processes, a portion of the encapsulant 402 that is located directly below the flat bottom FB of the cut lane G may be shaped as a flange portion 402F, and the sidewalls 502CS of the peripheral drape portion 502C are aligned with and coplanar with the sidewalls 402S of the flange portion 402F of the encapsulant 402. In some embodiments, the encapsulant 402 has stair-shaped sidewalls, and each stair-shaped sidewall consists of a lower portion of the vertical sidewall GS2, the sidewall 402S of the flange portion 402F and a horizontal surface FB connecting the sidewalls GS2 and 402S. In FIG. 15, the peripheral drape portion 502C covers the upper portion of the stair-shaped sidewall (i.e. the lower portion of the vertical sidewall GS2 and the horizontal surface FB).

As described in the previous paragraphs, the peripheral drape portion 502C of the protection layer 50C well protect the side surfaces of the interposer 100, so as to relieve the corner stress and cracking at the corner(s) of the interposer 100 and prevent delamination at the interfaces between the interposer 100, the underfill 35 and the encapsulant 402. Hence, the reliability of the package structure is significantly improved and the cracking risk is lowered by about 90%.

Figure 16:
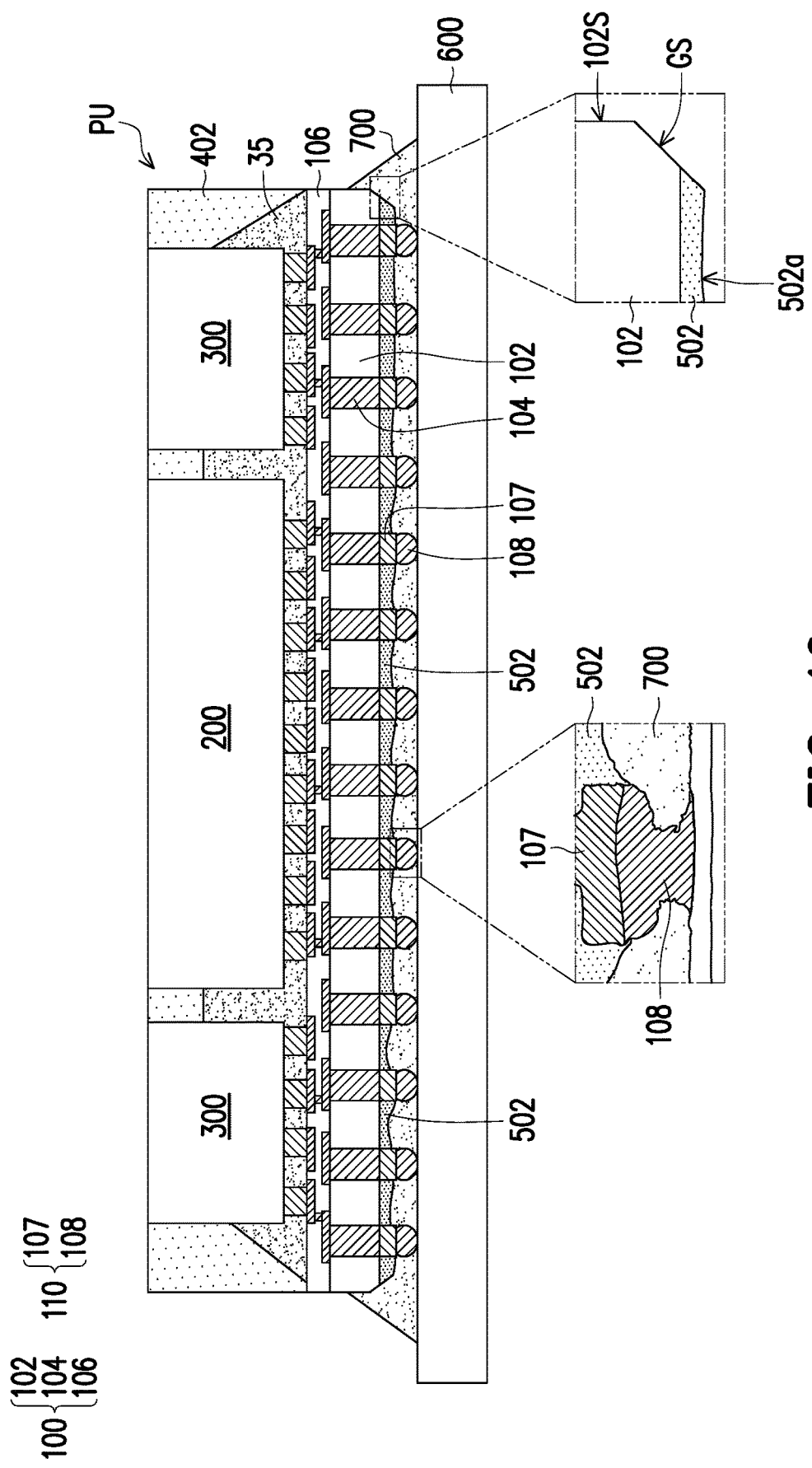
FIG. 16 is a schematic cross-sectional view illustrating a semiconductor package connected to a circuit substrate according to embodiments of the present disclosure.

FIG. 16 is a schematic cross-sectional view illustrating a semiconductor package connected to a circuit substrate according to embodiments of the present disclosure.

In some embodiments, the bevel cutting process is performed after the formation of the protection layer 502, and the bevel cutting process cuts through the protection layer 502 and some or all of the bulk substrate 102 of the underlying interposer 100. In some embodiments, the singulation process includes performing a bevel cutting process cutting out edge portions of the interposer 100 and then performing a vertical cutting process cutting through the rest of the interposer 100 and the encapsulant 402. In FIG. 16, the beveled edge GS extends from the surface 502a of the protection layer 502 to the sidewall 102S of the bulk substrate 102. Due to the existence of the beveled edges GS and the protection layer 502 covering the interposer 100, less corner cracking and better package reliability can be achieved.

In some embodiments of the present disclosure, a semiconductor package is provided. The semiconductor package includes at least one semiconductor die, an interposer, an encapsulant, a protection layer and connectors. The interposer has a first surface, a second surface opposite to the first surface and sidewalls connecting the first and second surfaces. The at least one semiconductor die is disposed on the first surface of interposer and electrically connected with the interposer. The encapsulant is disposed over the interposer and laterally encapsulates the at least one semiconductor die. The connectors are disposed on the second surface of the interposer and electrically connected with the at least one semiconductor die through the interposer. The protection layer is disposed on the second surface of the interposer and surrounds the connectors. The sidewalls of the interposer include slanted sidewalls connected to the second surface, and the protection layer is in contact with the slant sidewalls of the interposer.

In some embodiments of the present disclosure, a semiconductor package is provided. The semiconductor package includes semiconductor dies, an interposer, an encapsulant, a protection layer and connectors. The interposer has a first surface, a second surface opposite to the first surface and slant sidewalls extending from the second surface. The semiconductor dies are disposed on the first surface of interposer and electrically connected with the interposer. The encapsulant is disposed over the interposer and laterally encapsulates the semiconductor dies. The connectors are disposed on the second surface of the interposer. The protection layer is disposed on the second surface of the interposer and surrounds the connectors. The connectors are protruded from the protection layer, and the protection layer has a peripheral drape portion physically contacts and covers the slant sidewalls of the interposer.

In some embodiments of the present disclosure, a manufacturing method of a semiconductor package is provided. The manufacturing method includes the following steps. An interposer is provided, and semiconductor dies are provided and bonded to a mounting surface of the interposer. A molding compound is formed over the interposer to encapsulate the semiconductor dies to form a molded structure. A bevel cutting process is performed to form cut lanes in the interposer. A protection layer is formed over the interposer and filling the cut lanes. A singulation process is performed to the molded structure by cutting through the protection layer, cutting through the cut lanes and cutting though the molding compound to form individual semiconductor packages.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor package, comprising:
an interposer having a first surface, a second surface opposite to the first surface and sidewalls connecting the first and second surfaces;
at least one semiconductor die, disposed on the first surface of the interposer and electrically connected with the interposer;
an encapsulant, disposed over the interposer and laterally encapsulating the at least one semiconductor die;
connectors, disposed on the second surface of the interposer, and electrically connected with the at least one semiconductor die through the interposer; and
a protection layer, disposed on the second surface of the interposer and surrounding the connectors, wherein the sidewalls of the interposer include slanted sidewalls connected to the second surface, and the protection layer is in contact with the slant sidewalls of the interposer, and wherein a sidewall of the encapsulant is vertically aligned with a sidewall of the protection layer, and the slant sidewalls are unparallel to the sidewalls of the protection layer and the encapsulant.

2. The semiconductor package of claim 1, wherein the protection layer covers the whole slant sidewalls of the interposer.

3. The semiconductor package of claim 1, wherein the sidewalls of the protection layer are coplanar with the sidewalls of the encapsulant.

4. The semiconductor package of claim 1, further comprising an underfill filled between the at least one semiconductor die and the first surface of the interposer.

5. The semiconductor package of claim 4, wherein a material of the protection layer is different from a material of the underfill.

6. The semiconductor package of claim 1, wherein the protection layer is made of an insulating resin material.

7. The semiconductor package of claim 1, wherein the interposer includes through semiconductor vias, and the connectors are connected with the through semiconductor vias.

8. The semiconductor package of claim 4, wherein a material of the protection layer is different from a material of the encapsulant and different from a material of the underfill.

9. A semiconductor package, comprising:
an interposer having a first surface, a second surface opposite to the first surface and slant sidewalls extending from the second surface;
semiconductor dies, disposed on the first surface of the interposer and electrically connected with the interposer;
an encapsulant, disposed over the interposer and laterally encapsulating the semiconductor dies;
connectors, disposed on the second surface of the interposer; and
a protection layer, disposed on the second surface of the interposer and surrounding the connectors, wherein the connectors are protruded from the protection layer, and the protection layer has a peripheral drape portion physically contacts and covers the slant sidewalls of the interposer, and wherein a sidewall of the encapsulant is vertically aligned with a sidewall of the peripheral drape portion of the protection layer, and the slant sidewalls are unparallel to the sidewalls of the encapsulant and the peripheral drape portion.

10. The semiconductor package of claim 9, wherein an angle between the second surface and each slant sidewall ranges from about 105 degrees to about 130 degrees.

11. The semiconductor package of claim 10, further comprising an underfill filled between the semiconductor dies and the first surface of the interposer.

12. The semiconductor package of claim 11, wherein a material of the protection layer is different from a material of the underfill.

13. The semiconductor package of claim 9, wherein the protection layer is made of an insulating resin material.

14. The semiconductor package of claim 9, wherein the interposer includes through semiconductor vias, and the connectors are connected with the through semiconductor vias.

15. The semiconductor package of claim 11, wherein a material of the protection layer is different from a material of the encapsulant and different from a material of the underfill.

16. A semiconductor package, comprising:
an interposer having a first surface, a second surface opposite to the first surface and slant sidewalls extending from the second surface, wherein the interposer includes a substrate, conductive vias embedded within the substrate and a redistribution layer disposed on the substrate;
semiconductor dies, disposed on the first surface of the interposer and electrically connected with the interposer;
an encapsulant, disposed over the interposer and laterally encapsulating the semiconductor dies;
connectors, disposed on the second surface of the interposer and on the conductive vias; and
an insulative protection layer, disposed on the second surface of the interposer and surrounding the connectors, wherein the insulative protection layer has a peripheral drape portion physically contacts and covers the slant sidewalls of the interposer.

17. The semiconductor package of claim 16, further comprising a first underfill filled between the semiconductor dies and the first surface of the interposer.

18. The semiconductor package of claim 17, further comprising a circuit substrate, wherein the interposer is electrically connected with the circuit substrate through the connectors.

19. The semiconductor package of claim 18, further comprising a second underfill filled between the circuit substrate and the interposer.

20. The semiconductor package of claim 19, wherein the second underfill covers the peripheral drape portion.

* * * * *